United States Patent
Meng et al.

(10) Patent No.: US 10,958,203 B2
(45) Date of Patent: Mar. 23, 2021

(54) METHOD FOR CALIBRATING FREQUENCY OF DRIVING VOLTAGE WAVEFORM FOR LINEAR RESONANCE DEVICE AND RELATED DEVICE

(71) Applicant: Shanghai Awinic Technology Co., LTD, Shanghai (CN)

(72) Inventors: Zhijun Meng, Shanghai (CN); Shaofu Wu, Shanghai (CN); Guanxing Zhao, Shanghai (CN); Dajun Wu, Shanghai (CN)

(73) Assignee: Shanghai Awinic Technology Co., LTD, Shanghai (CN)

( * ) Notice: Subject to any disclaimer, the term of this patent is extended or adjusted under 35 U.S.C. 154(b) by 0 days.

(21) Appl. No.: 16/683,878

(22) Filed: Nov. 14, 2019

(65) Prior Publication Data
US 2020/0195184 A1    Jun. 18, 2020

(30) Foreign Application Priority Data
Dec. 13, 2018    (CN) .......................... 201811526755.X

(51) Int. Cl.
  *H02P 25/032* (2016.01)
  *H02P 25/06* (2016.01)
  *G01R 23/00* (2006.01)

(52) U.S. Cl.
  CPC .......... *H02P 25/032* (2016.02); *G01R 23/005* (2013.01); *H02P 25/06* (2013.01)

(58) Field of Classification Search
  CPC ..... H02P 25/032; H02P 25/06; G01R 23/005; G01R 35/00
  See application file for complete search history.

(56) References Cited

U.S. PATENT DOCUMENTS

| | | | |
|---|---|---|---|
| 6,437,524 B1 * | 8/2002 | Dimanstein | H02P 25/032 318/119 |
| 7,132,874 B2 | 11/2006 | McCorquodale et al. | |
| | | (Continued) | |

FOREIGN PATENT DOCUMENTS

| | | |
|---|---|---|
| CN | 1236378 C | 1/2006 |
| CN | 101194416 A | 6/2008 |
| | (Continued) | |

OTHER PUBLICATIONS

First Taiwanese Office Action regarding Application No. 108139800 dated Aug. 3, 2020. English translation provided by Unitalen Attorneys at Law.

*Primary Examiner* — Thai T Dinh
(74) *Attorney, Agent, or Firm* — Harness, Dickey & Pierce, P.L.C.

(57) ABSTRACT

There are provided a method, a system and a device for calibrating a frequency of a driving voltage waveform for a linear resonance device. An actual sampling frequency is continuously corrected, so that a difference between a measured natural frequency of the linear resonance device obtained during a calibration process and a frequency of a standard driving voltage waveform stored in a driving chip for the linear resonance device is in a predetermined range. The driving chip outputs a driving waveform at a finally corrected actual sampling frequency, to drive the linear resonance device. Further, only an actual sampling frequency is required to be adjusted, and it is not required to modify waveform data stored in the driving chip for the linear resonance device.

17 Claims, 2 Drawing Sheets

(56) References Cited

U.S. PATENT DOCUMENTS

| | | | |
|---|---|---|---|
| 7,227,423 B2 | 6/2007 | McCorquodale et al. | |
| 7,227,424 B2 | 6/2007 | McCorquodale et al. | |
| 7,248,124 B2 | 7/2007 | McCorquodale et al. | |
| 7,307,486 B2 | 12/2007 | Pernia et al. | |
| 7,358,826 B2 | 4/2008 | McCorquodale et al. | |
| 7,365,614 B2 | 4/2008 | McCorquodale et al. | |
| 7,456,699 B2 | 11/2008 | McCorquodale et al. | |
| 7,504,899 B2 | 3/2009 | McCorquodale et al. | |
| 7,545,227 B2 | 6/2009 | Pernia et al. | |
| 7,545,231 B2 | 6/2009 | McCorquodale et al. | |
| 7,548,125 B2 | 6/2009 | Carichner et al. | |
| 7,548,132 B2 | 6/2009 | McCorquodale et al. | |
| 7,656,243 B2 | 2/2010 | McCorquodale et al. | |
| 7,656,244 B2 | 2/2010 | McCorquodale et al. | |
| 7,656,245 B2 | 2/2010 | McCorquodale et al. | |
| 7,679,463 B2 | 3/2010 | Pernia et al. | |
| 7,719,371 B2 | 5/2010 | Pernia et al. | |
| 7,786,812 B2 | 8/2010 | McCorquodale et al. | |
| 7,872,541 B2 | 1/2011 | McCorquodale et al. | |
| 7,924,110 B2 | 4/2011 | McCorquodale et al. | |
| 7,978,017 B2 | 7/2011 | Pernia et al. | |
| 8,093,958 B2 | 1/2012 | O'Day et al. | |
| 8,095,813 B2 | 1/2012 | Pernia et al. | |
| 8,314,586 B2 * | 11/2012 | Lumbantobing | A61B 5/4842 318/807 |
| 9,054,627 B2 * | 6/2015 | Garg | H02P 25/032 |
| 9,240,792 B2 | 1/2016 | McCorquodale et al. | |
| 9,344,022 B2 * | 5/2016 | Khan | H02P 29/032 |
| 9,515,750 B2 | 12/2016 | Mofidi et al. | |
| 2004/0222838 A1 | 11/2004 | McCorquodale et al. | |
| 2005/0206462 A1 | 9/2005 | McCorquodale et al. | |
| 2005/0206464 A1 | 9/2005 | McCorquodale et al. | |
| 2006/0017519 A1 | 1/2006 | Pernia et al. | |
| 2006/0071718 A1 | 4/2006 | McCorquodale et al. | |
| 2006/0071734 A1 | 4/2006 | McCorquodale et al. | |
| 2006/0152293 A1 | 7/2006 | McCorquodale et al. | |
| 2006/0158267 A1 | 7/2006 | McCorquodale et al. | |
| 2006/0158268 A1 | 7/2006 | McCorquodale et al. | |
| 2007/0205837 A1 | 9/2007 | McCorquodale et al. | |
| 2007/0205842 A1 | 9/2007 | McCorquodale et al. | |
| 2007/0222528 A1 | 9/2007 | Pernia et al. | |
| 2007/0222529 A1 | 9/2007 | Carichner et al. | |
| 2008/0018407 A1 | 1/2008 | McCorquodale et al. | |
| 2008/0048794 A1 | 2/2008 | Mccorquodale et al. | |
| 2008/0100350 A1 | 5/2008 | Pernia et al. | |
| 2008/0100392 A1 | 5/2008 | Pernia et al. | |
| 2008/0104435 A1 | 5/2008 | Pernia et al. | |
| 2008/0143454 A1 | 6/2008 | McCorquodale et al. | |
| 2008/0150645 A1 | 6/2008 | McCorquodale et al. | |
| 2009/0146719 A1 | 6/2009 | Pernia et al. | |
| 2009/0146748 A1 | 6/2009 | Pernia et al. | |
| 2009/0146750 A1 | 6/2009 | Pernia et al. | |
| 2009/0146751 A1 | 6/2009 | Pernia et al. | |
| 2009/0146752 A1 | 6/2009 | O'Day et al. | |
| 2009/0167444 A1 | 7/2009 | McCorquodale et al. | |
| 2009/0167451 A1 | 7/2009 | McCorquodale et al. | |
| 2010/0019856 A1 | 1/2010 | McCorquodale et al. | |
| 2011/0169585 A1 | 7/2011 | McCorquodale et al. | |
| 2014/0253256 A1 | 9/2014 | McCorquodale et al. | |
| 2015/0137713 A1 * | 5/2015 | Barsilai | H02P 25/06 318/114 |
| 2016/0134382 A1 | 5/2016 | Mofidi et al. | |
| 2017/0133966 A1 | 5/2017 | Khan et al. | |
| 2017/0169674 A1 | 6/2017 | Macours | |

FOREIGN PATENT DOCUMENTS

| | | |
|---|---|---|
| CN | 103576858 | 2/2014 |
| CN | 108398658 A | 8/2018 |
| TW | 200635235 A | 10/2006 |
| TW | 201618479 A | 5/2016 |
| WO | WO-0242992 A1 | 5/2002 |

* cited by examiner

METHOD FOR CALIBRATING FREQUENCY OF DRIVING VOLTAGE WAVEFORM FOR LINEAR RESONANCE DEVICE AND RELATED DEVICE

CROSS REFERENCE TO RELATED APPLICATION

The present application claims priority to Chinese Patent Application No. 201811526755.X, titled "METHOD FOR CALIBRATING FREQUENCY OF DRIVING VOLTAGE WAVEFORM FOR LINEAR RESONANCE DEVICE AND RELATED DEVICE", filed on Dec. 13, 2018 with the Chinese Patent Office, which is incorporated herein by reference in its entirety.

FIELD

The present disclosure relates to the technical field of linear resonance devices, and in particular to a method, a system and a device for calibrating a frequency of a driving voltage waveform for a linear resonance device.

BACKGROUND

The tactile feedback technology is a technology used for generating tactile effects. With the tactile feedback technology, manufacturers of consumer electronic devices may create personalized tactile feedback for specific interactive experience on the consumer electronic devices, so as to provide worthful and vivid experience for users. The tactile feedback technology is generally implemented by oscillation of an actuator. A linear resonance actuator (LRA) includes a spring, a magnetic mass block and a coil. The coil is suspended in the linear resonance actuator by means of the spring. In a case that a current flows through the coil, a magnetic field is produced by the coil. The coil is connected to the magnetic mass block. If the current flowing through the coil changes, a direction and an intensity of the magnetic field change accordingly. In this case, the mass block may move up and down in the changing magnetic field. The movement of the mass block is perceived by a user, and thus the tactile feedback effects can be generated.

By applying the tactile feedback technology of the linear resonance actuator on a portable terminal, various levels of clangorous vibration can be generated, and even the tactile feedback effects meeting various application requirements can be simulated, for example, vibration effects of a key switch, a music melody or a heartbeat.

A driving chip for the linear resonance actuator stores waveform data of a standard driving voltage waveform. In the conventional technology, in a process that the linear resonance actuator is driven, an actual sampling frequency of the driving chip is calibrated to a standard sampling frequency by means of a high precision instrument, and induced electromotive force of the actuator is collected to obtain an actual natural frequency of the actuator. Then, the waveform data in a waveform library is adjusted, and the standard driving voltage waveform is read at the actual sampling frequency equal to the standard sampling frequency, so that a frequency of a final outputted waveform is equal to the actual natural frequency of the actuator. In the conventional calibrating technology, not only the actual sampling frequency is required to be calibrated by means of the high precise instrument, but also the waveform data stored in the driving chip is required to be adjusted to adapt to actuators with different natural frequencies, so as to achieve the final calibration. Due to complexity of the conventional calibration method, the calibrating difficulty of the consumer electronic devices before being shipped is increased. Further, the waveform data stored in the driving chip is generally configured before the consumer electronic devices are shipped. After the long use of the consumer electronic devices, the natural frequency of the actuator may shift due to the ambient temperature, the ambient humidity and the element aging, and the calibrated actual sampling frequency before being shipped may also shift. In this case, the actual sampling frequency is required to be recalibrated by means of the high precise instrument, and the waveform data stored in the driving chip is required to be reconfigured to adapt to the shifted natural frequency of the actuator, which results in the difficulty of performing self-calibrating on the actuator after the consumer electronic devices are shipped.

SUMMARY

In view of this, there are provided a method, a system and a device for calibrating a frequency of a driving voltage waveform for a linear resonance device in the present disclosure.

The following technical solutions are provided in the present disclosure.

There is provided a method for calibrating a frequency of a driving voltage waveform for a linear resonance device. A driving chip for the linear resonance device stores waveform data of a standard driving voltage waveform. The method includes:

step S1: reading the standard driving voltage waveform at an actual sampling frequency and driving the linear resonance device to operate;

step S2: stopping the driving of the linear resonance device, and collecting an induced electromotive force waveform of the linear resonance device in free oscillation at the actual sampling frequency;

step S3: calculating, based on a standard sampling frequency, a frequency of the induced electromotive force waveform as a measured natural frequency of the linear resonance device;

step S4: determining whether a difference between the measured natural frequency and a frequency of the standard driving voltage waveform is in a predetermined range, and storing the actual sampling frequency in a case that the difference between the measured natural frequency and the frequency of the standard driving voltage waveform is in the predetermined range, and correcting the actual sampling frequency and performing steps S1 to S4 again in a case that the difference between the measured natural frequency and the frequency of the standard driving voltage waveform is out of the predetermined range.

In an embodiment, the method is performed until the difference between the measured natural frequency and the frequency of the standard driving voltage waveform is less than a preset value.

In an embodiment, the process of reading the standard driving voltage waveform at an actual sampling frequency and driving the linear resonance device to operate includes: reading the standard driving voltage waveform at the actual sampling frequency and driving the linear resonance device to operate for a time period not less than 50 ms.

In an embodiment, the predetermined range is from 0.5 Hz to 1 Hz, inclusive.

In an embodiment, performing n-th correction on the actual sampling frequency includes:

calculating an n-th correction coefficient $Er\_n$ according to a formula expressed as $Er\_n=Er\_n-1*F0\_measured\_n/Fwav\_preset$, where $Er\_n-1$ represents an (n−1)-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one; and correcting the actual sampling frequency by the n-th correction coefficient, where an actual sampling frequency $Fs\_n$ obtained after the n-th correction is performed is expressed as $Fs\_n=Er\_n*Fs\_0$, and $Fs\_0$ represents an initial actual sampling frequency.

There is further provided a system for calibrating a frequency of a driving voltage waveform for a linear resonance device in the present disclosure. The system is integrated in the linear resonance device. The system is integrated in a driving chip for the linear resonance device. The driving chip stores waveform data of a standard driving voltage waveform. The driving chip includes a driving control circuit, a collection circuit, a processing circuit and a clock adjusting circuit, where the driving control circuit is connected to the linear resonance device, and the driving control circuit is configured to read the standard driving voltage waveform at an actual sampling frequency and drive the linear resonance device to operate;

the collection circuit is connected to the linear resonance device, and the collection circuit is configured to: collect an induced electromotive force waveform of the linear resonance device in free oscillation at the actual sampling frequency after the driving control circuit stops the driving of the linear resonance device;

the processing circuit is connected to the collection circuit, and the processing circuit is configured to: calculate, based on a standard sampling frequency, a frequency of the induced electromotive force waveform as a measured natural frequency of the linear resonance device, and determine whether a difference between the measured natural frequency and a frequency of the standard driving voltage waveform is in a predetermined range; and the clock adjusting circuit is connected to the processing circuit and the driving control circuit, and the clock adjusting circuit is configured to: in a case that the difference between the measured natural frequency and the frequency of the standard driving voltage waveform is in the predetermined range, store the actual sampling frequency; and in a case that the difference between the measured natural frequency and the frequency of the standard driving voltage waveform is out of the predetermined range, correct the actual sampling frequency, where the driving control circuit, the collection circuit, the processing circuit and the clock adjusting circuit operate accordingly in response to the corrected actual sampling frequency.

In an embodiment, the collection circuit is an analog-to-digital conversion circuit.

In an embodiment, the clock adjusting circuit performs an n-th correction on the actual sampling frequency by:

calculating an n-th correction coefficient $Er\_n$ according to a formula expressed as $Er\_n=Er\_n-1*F0\_measured\_n/Fwav\_preset$, where $Ern-1$ represents an (n−1)-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one; and correcting the actual sampling frequency by the n-th correction coefficient, where an actual sampling frequency $Fs\_n$ obtained after the n-th correction is performed is expressed as $Fs\_n=Er\_n*Fs\_0$, and $Fs\_0$ represents an initial actual sampling frequency.

There is further provided a calibrating device for calibrating a frequency of a driving voltage waveform for a linear resonance device in the present disclosure. The calibrating device stores waveform data of a standard driving voltage waveform. The calibrating device includes a driving controller, a collector, a master processor and a clock adjuster, where the driving controller is connected to the linear resonance device, and the driving controller is configured to read the standard driving voltage waveform at an actual sampling frequency and drive the linear resonance device to operate;

the collector connected to the linear resonance device, and the collector is configured to: collect an induced electromotive force waveform of the linear resonance device in free oscillation at the actual sampling frequency after the driving controller stops the driving of the linear resonance device;

the master processor is connected to the collector, and the master processor is configured to: calculate, based on a standard sampling frequency, a frequency of the induced electromotive force waveform as a measured natural frequency of the linear resonance device, and determine whether a difference between the measured natural frequency and a frequency of the standard driving voltage waveform is in a predetermined range; and the clock adjuster is connected to the master processor and the driving controller, and the clock adjuster is configured to: in a case that the difference between the measured natural frequency and the frequency of the standard driving voltage waveform is in the predetermined range, store the current actual sampling frequency in the calibrating device; and in a case that the difference between the measured natural frequency and the frequency of the standard driving voltage waveform is out of the predetermined range, correct the actual sampling frequency, where the driving controller, the collector, the master processor and the clock adjuster operate accordingly in response to the corrected actual sampling frequency.

In an embodiment, the collector is a collecting card.

In an embodiment, the clock adjuster performs an n-th correction on the actual sampling frequency by:

calculating an n-th correction coefficient $Er\_n$ according to a formula expressed as $Er\_n=Er\_n-1*F0\_measured\_n/Fwav\_preset$, where $Er\_n-1$ represents an (n−1)-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one; and correcting the actual sampling frequency by the n-th correction coefficient, where an actual sampling frequency $Fs\_n$ obtained after the n-th correction is performed is expressed as $Fs\_n=Er\_n*Fs\_0$, and $Fs\_0$ represents an initial actual sampling frequency.

Compared with the conventional technology, the technical solutions provided in the present disclosure have at least the following advantages.

With the method, the system and the device for calibrating a frequency of a driving voltage waveform for a linear resonance device provided in the present disclosure, the actual sampling frequency is continuously corrected, so that the difference between the measured natural frequency of the linear resonance device obtained during the calibration process and the frequency of the standard driving voltage waveform stored in the driving chip is in the predetermined range. The driving chip outputs a driving waveform at a finally corrected actual sampling frequency, to drive the linear resonance device. In this way, the frequency of the actual driving voltage waveform for the linear resonance device is consistent with the actual natural frequency of the linear resonance device, thereby ensuring excellent vibration of the linear resonance actuator.

Further, with the technical solutions in the embodiment of the present disclosure, only the actual sampling frequency is required to be adjusted, and it is not required to modify the waveform data stored in the driving chip for the linear resonance device. In this way, a consumer electronic device using the frequency calibration method provided in the present disclosure can be automatically calibrated anytime and anywhere either before or after being shipped, further extending an applicable range of the frequency calibration method.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION OF EMBODIMENTS

Figure 1:
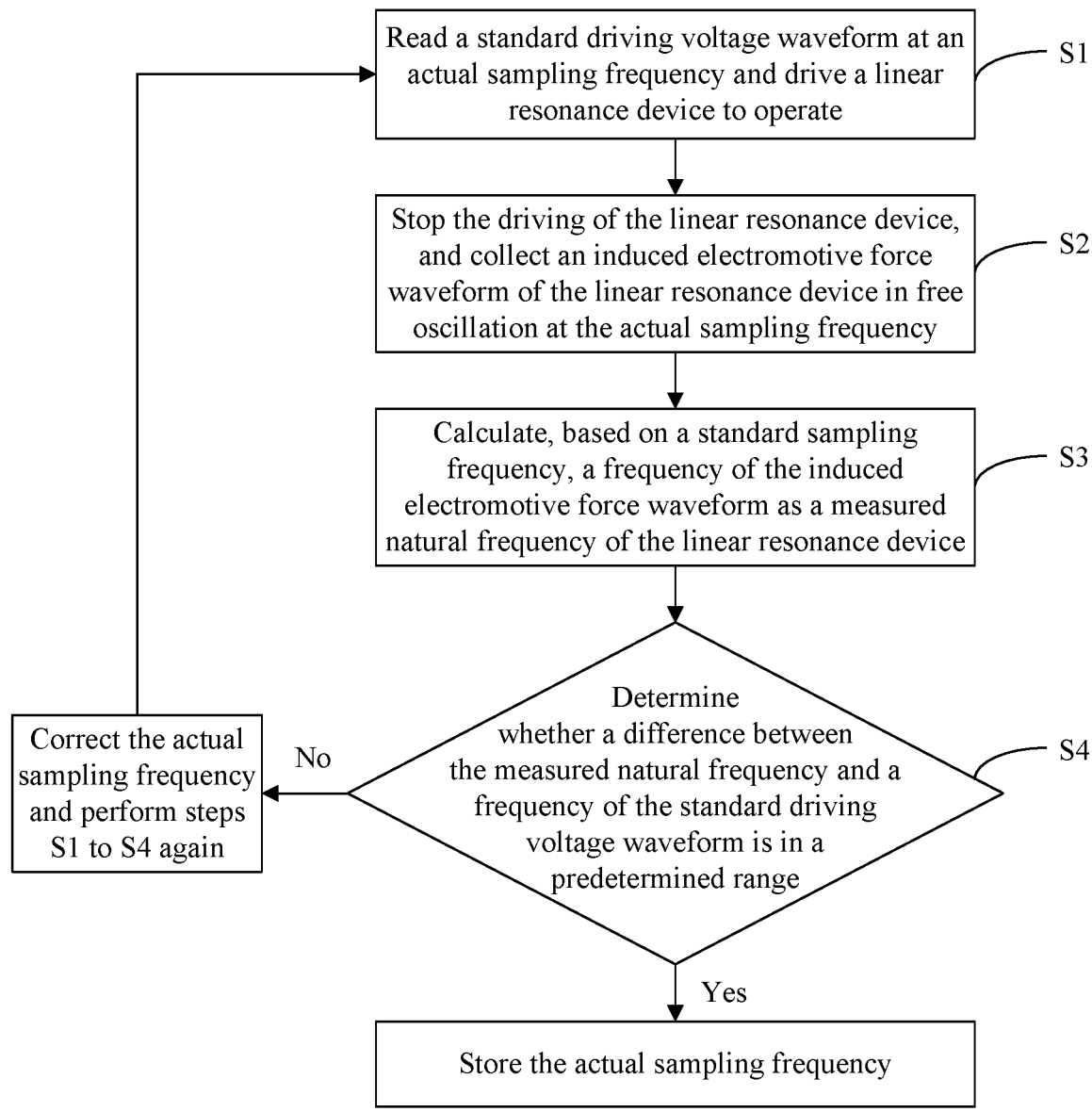
FIG. 1 is a schematic flowchart of a method for calibrating a frequency of a driving voltage waveform for a linear resonance device according to an embodiment of the present disclosure.

Technical solutions in embodiments of the present disclosure are described clearly and completely in conjunction with the drawings in the embodiments of the present disclosure hereinafter. It is apparent that the described embodiments are only some embodiments of the present disclosure, rather than all embodiments. All other embodiments obtained by those skilled in the art based on the embodiments of the present disclosure without any creative work fall within the protection scope of the present disclosure.

As described and analyzed above, a driving chip for a linear resonance actuator stores waveform data of a standard driving voltage waveform. In the conventional technology, in a process that the linear resonance actuator is driven, an actual sampling frequency of the driving chip is calibrated to a standard sampling frequency by means of a high precision instrument, and induced electromotive force of the actuator is collected to obtain an actual natural frequency of the actuator. Then, the waveform data in a waveform library is adjusted, and the standard driving voltage waveform is read at the actual sampling frequency equal to the standard sampling frequency, so that a frequency of a final outputted waveform is equal to the actual natural frequency of the actuator. In the conventional calibrating technology, not only the actual sampling frequency is required to be calibrated by means of the high precise instrument, but also the waveform data stored in the driving chip is required to be adjusted to adapt to actuators with different natural frequencies, so as to achieve the final calibration. Due to complexity of the conventional calibration method, the calibrating difficulty of the consumer electronic devices before being shipped is increased. Further, the waveform data stored in the driving chip is generally configured before the consumer electronic devices are shipped. After the long use of the consumer electronic devices, the natural frequency of the actuator may shift due to the ambient temperature, the ambient humidity and the element aging, and the calibrated actual sampling frequency before being shipped may also shift. In this case, the actual sampling frequency is required to be recalibrated by means of the high precise instrument, and the waveform data stored in the driving chip is required to be reconfigured to adapt to the shifted natural frequency of the actuator, which results in the difficulty of performing self-calibrating on the actuator after the consumer electronic devices are shipped.

In view of this, there are provided a method, a system and a device for calibrating a frequency of a driving voltage waveform for a linear resonance device in various embodiments of the present disclosure, to effectively solve the technical problems existing in the conventional technology, so that a frequency of an actual driving voltage waveform for the linear resonance device is consistent with an actual natural frequency of the linear resonance device, thereby ensuring good vibration of the linear resonance actuator. Further, with technical solutions in the present disclosure, only an actual sampling frequency is required to be adjusted, and it is not required to modify waveform data stored in a driving chip for the linear resonance device. In this way, a consumer electronic device using the frequency calibration method provided in the present disclosure can be automatically calibrated anytime and anywhere either before or after being shipped, further extending an applicable range of the frequency calibration method. The following technical solutions are provided in the present disclosure, which are described below in detail with reference to FIGS. 1 to 3.

Reference is made to FIG. 1, which is a schematic flowchart of a method for calibrating a frequency of a driving voltage waveform for a linear resonance device according to an embodiment of the present disclosure. A driving chip for the linear resonance device stores waveform data of a standard driving voltage waveform. The method includes the following steps S1 to S4.

In S1, the standard driving voltage waveform is read at an actual sampling frequency, and the linear resonance device is driven to operate.

In S2, the driving of the linear resonance device is stopped, and an induced electromotive force waveform of the linear resonance device in free oscillation is collected at the actual sampling frequency.

In S3, based on a standard sampling frequency, a frequency of the induced electromotive force waveform is calculated as a measured natural frequency of the linear resonance device. The standard sampling frequency is a default sampling frequency set for the driving chip for the linear resonance device.

In S4, it is determined whether a difference between the measured natural frequency and a frequency of the standard driving voltage waveform is in a predetermined range. In a case that the difference between the measured natural frequency and the frequency of the standard driving voltage waveform is in the predetermined range, the actual sampling frequency is stored. In a case that the difference between the measured natural frequency and the frequency of the standard driving voltage waveform is out of the predetermined range, the actual sampling frequency is corrected, and steps S1 to S4 are performed again until the difference is in the predetermined range.

That is, in the case that the difference is out of the predetermined range, a current actual sampling frequency is corrected, and the method returns to step S1. The standard driving voltage waveform is read at the corrected actual sampling frequency and the linear resonance device is driven to operate again. Next, steps S2 to S4 are performed again. The method is performed repeatedly until it is determined that the difference between the measured natural frequency and the frequency of the standard driving voltage waveform is in the predetermined range in step S4. The frequency of the standard driving voltage waveform is a frequency of a waveform that is pre-stored based on the standard sampling frequency.

It should be understood that, the predetermined range is not limited in the embodiment of the present disclosure, as long as a frequency of a driving voltage waveform actually outputted from the driving chip, after the standard driving voltage waveform is read at a finally obtained actual sampling frequency, is consistent with the actual natural frequency of the linear resonance device. In an embodiment of the present disclosure, the predetermined range may be from 0.5 Hz to 1 Hz, inclusive.

In can be seen that, with the technical solutions in the embodiment of the present disclosure, the actual sampling frequency is continuously corrected, so that the difference between the measured natural frequency of the linear resonance device obtained during the calibration process and the frequency of the standard driving voltage waveform stored in the driving chip is in the predetermined range. The driving chip outputs a driving waveform at a finally corrected actual sampling frequency, to drive the linear resonance device. In this way, the frequency of the actual driving voltage waveform for the linear resonance device is consistent with the actual natural frequency of the linear resonance device, thereby ensuring excellent vibration of the linear resonance actuator.

Further, with the technical solutions in the embodiment of the present disclosure, only the actual sampling frequency is required to be adjusted, and it is not required to modify the waveform data stored in the driving chip for the linear resonance device. In this way, a consumer electronic device using the frequency calibration method provided in the present disclosure can be automatically calibrated anytime and anywhere either before or after being shipped, further extending an applicable range of the frequency calibration method.

In an embodiment of the present disclosure, in order to better collect the induced electromotive force waveform of the linear resonance device in free oscillation, the linear resonance device is required to oscillate for a long time period. The process of reading the standard driving voltage waveform at the actual sampling frequency and driving the linear resonance device to operate includes: reading the standard driving voltage waveform at the actual sampling frequency and driving the linear resonance device to operate for a time period not less than 50 ms.

In an embodiment of the present disclosure, the induced electromotive force of the linear resonance device in free oscillation is collected at the actual sampling frequency used by the driving chip before the driving of the linear resonance device is stopped.

It should be understood that, in a process that the measured natural frequency of the linear resonance device is detected, the standard driving voltage waveform is read at an actual sampling frequency, and the linear resonance device is driven to oscillate for a long time period. Then, the driving of the linear resonance device is stopped. In this case, the driving chip no longer outputs the actual driving voltage waveform, and the linear resonance device freely oscillates rather than is shut down immediately. The linear resonance device generates induced electromotive force in the free oscillation. A value of the induced electromotive force is recorded at a certain time interval based on the actual sampling frequency. The finally obtained values are connected together with a curve to obtain the induced electromotive force waveform. Since the standard sampling frequency is set as a default sampling frequency in a built-in algorithm of the driving chip, the measured natural frequency of the linear resonance device can be calculated based on the standard sampling frequency.

With the technical solutions in the embodiment of the present disclosure, the frequency of the actual driving voltage waveform can be calibrated without calculating the actual natural frequency of the linear resonance device and modifying the waveform data of the standard driving voltage waveform stored in the driving chip, which is verified below by inference.

In the embodiment of the present disclosure, the induced electromotive force waveform of the linear resonance device is collected at an actual sampling frequency (which is indicated by Fs), the measured natural frequency (which is indicated by F0_measured) of the linear resonance device is calculated based on the standard sampling frequency (which is indicated by Fs_default), and the linear resonance device has the actual natural frequency (which is indicated by F0_actual). In this case, the following formula (1) is obtained:

$$\text{F0\_measured} = \frac{\text{Fs\_default}}{Fs} \times \text{F0\_actual} \qquad (1)$$

The actual driving voltage waveform is read at the actual sampling frequency (Fs), and the standard driving voltage waveform is generated based on the frequency (which is indicated by Fwav_preset) of the standard driving voltage waveform and the standard sampling frequency (Fs_default). In this case, the following formula (2) is obtained:

$$\text{Fwav\_preset} = \frac{\text{Fs\_default}}{N} \qquad (2)$$

Where N represents the number of data points of the standard driving voltage waveform in a single collection cycle.

The frequency (which is indicated by Fwav_actual) of the actual driving voltage waveform is related to the actual sampling frequency (Fs). In this case, the following formula (3) is obtained:

$$\text{Fwav\_actual} = \frac{Fs}{N} \qquad (3)$$

Based on formula (2) and formula (3), the following formula (4) is obtained:

$$Fwav\_preset = \frac{Fs\_default}{Fs} \times Fwav\_actual \quad (4)$$

In a case that the measured natural frequency is equal to the frequency of the standard driving voltage waveform, i.e., $$F0\_measured = Fwav\_preset \quad (5)$$

the following formulas (6) and formula (7) are obtained:

$$\frac{Fs\_default}{Fs} \times F0\_actual = \frac{Fs\_default}{Fs} \times Fwav\_actual \quad (6)$$

$$F0\_actual = Fwav\_actual \quad (7)$$

With the technical solutions in the embodiment of the present disclosure, the actual sampling frequency is continuously corrected, so that the difference between the measured natural frequency of the linear resonance device obtained during the calibration process and the frequency of the standard driving voltage waveform stored in the driving chip is in the predetermined range. The driving chip outputs a driving waveform at a finally corrected actual sampling frequency, to drive the linear resonance device. In this way, the frequency of the actual driving voltage waveform for the linear resonance device is consistent with the actual natural frequency of the linear resonance device, thereby ensuring good vibration of the linear resonance actuator.

In an embodiment of the present disclosure, the actual sampling frequency is corrected by an iteration process. The process of performing n-th correction on the actual sampling frequency includes:

calculating an n-th correction coefficient Er_n according to a formula expressed as Er_n=Er_n−1*F0_measured_n/Fwav_preset, where Er_n−1 represents an (n−1)-th correction coefficient, F0_measured_n represents a measured natural frequency obtained by performing steps S1 to S4 for the n-th time, Fwav_preset represents the frequency of the standard driving voltage waveform, n is an integer not less than 1, and Er_0 is set to one; and correcting the actual sampling frequency by the n-th correction coefficient.

A actual sampling frequency Fs_n obtained after the n-th correction is performed is expressed as Fs_n=Er_n*Fs_0, where Fs_0 represents an initial actual sampling frequency, i.e., the actual sampling frequency used for performing steps S1 to S4 for the first time.

In an embodiment of the present disclosure, in the process of storing the actual sampling frequency in the case that the difference between the measured natural frequency and the frequency of the standard driving voltage waveform is in the predetermined range, the n-th correction coefficient is stored. In this case, the standard driving voltage waveform may be read based on the n-th correction coefficient and the initial actual sampling frequency, and the linear resonance device is driven to operate.

Figure 2:
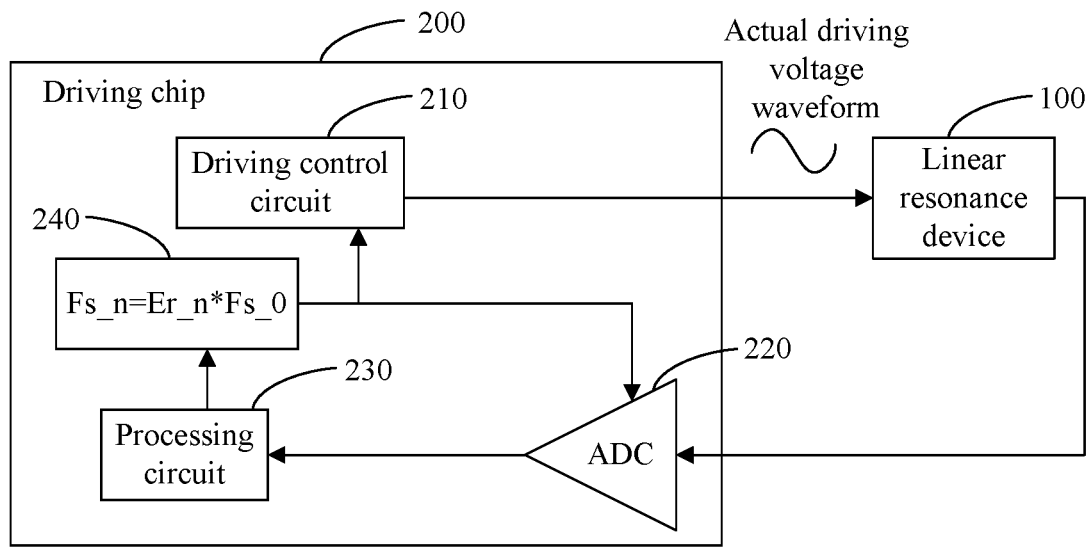
FIG. 2 is a schematic structural diagram of a system for calibrating a frequency of a driving voltage waveform for a linear resonance device according to an embodiment of the present disclosure.

There is further provided a system for calibrating a frequency of a driving voltage waveform for a linear resonance device according to an embodiment of the present disclosure. The frequency calibrating system may be integrated in a driving chip for the linear resonance device. The frequency calibrating system may also be used as a stand-alone system and is connected with the driving chip. In a case that the frequency calibrating system is integrated in the driving chip, the frequency calibrating system may be independent of an existing structure of the driving chip or may use components in the driving chip, which is not limited in the present disclosure. Reference is made to FIG. 2, which is a schematic structural diagram of a system for calibrating a frequency of a driving voltage waveform for a linear resonance device according to an embodiment of the present disclosure. The system is integrated in a driving chip 200 for a linear resonance device 100. The driving chip 200 stores waveform data of a standard driving voltage waveform. The driving chip 200 includes a driving control circuit 210, a collection circuit 220, a processing circuit 230, and a clock adjusting circuit 240.

The driving control circuit 210 is connected to the linear resonance device 100. The driving control circuit 210 is configured to read the standard driving voltage waveform at an actual sampling frequency and drive the linear resonance device 100 to operate.

The collection circuit 220 is connected to the linear resonance device 100. The collection circuit 220 is configured to collect an induced electromotive force waveform of the linear resonance device 100 in free oscillation at the actual sampling frequency after the driving control circuit 210 stops the driving of the linear resonance device 100.

The processing circuit 230 is connected to the collection circuit 220. The processing circuit 230 is configured to: calculate, based on a standard sampling frequency, a frequency of the induced electromotive force waveform as a measured natural frequency of the linear resonance device 100, and determine whether a difference between the measured natural frequency and a frequency of the standard driving voltage waveform is in a predetermined range.

The clock adjusting circuit 240 is connected to the processing circuit 230 and the driving control circuit 210. The clock adjusting circuit 240 is configured to: in a case that the difference between the measured natural frequency and the frequency of the standard driving voltage waveform is in the predetermined range, store the actual sampling frequency; and in a case that the difference between the measured natural frequency and the frequency of the standard driving voltage waveform is out of the predetermined range, correct the actual sampling frequency. The driving control circuit 210, the collection circuit 220, the processing circuit 230, and the clock adjusting circuit 240 operate accordingly in response to the corrected actual sampling frequency.

After the actual sampling frequency is corrected, the corrected actual sampling frequency is transmitted to the driving control circuit 210. The driving control circuit 210 is further configured to read the standard driving voltage waveform at the corrected actual sampling frequency, and to drive the linear resonance device 100 to operate. Then, the collection circuit 220, the processing circuit 230 and the clock adjusting circuit 240 are configured to continue the respective operation until the difference between the measured natural frequency and the frequency of the standard driving voltage waveform is in the predetermined range.

In an embodiment of the present disclosure, the clock adjusting circuit may store data related to the corrected actual sampling frequency in the driving chip. In this case, the driving control circuit may acquire the actual sampling frequency from a storage structure of the driving chip, so as to drive the linear resonance device.

In an embodiment of the present disclosure, the collection circuit is implemented by an analog-to-digital conversion circuit ADC.

The analog-to-digital conversion circuit ADC is connected to the clock adjusting circuit 240. The analog-to-digital conversion circuit ADC is configured to collect the induced electromotive force waveform of the linear resonance device 100 in free oscillation at the actual sampling frequency.

In an embodiment of the present disclosure, the clock adjusting circuit performs an n-th correction on the actual sampling frequency by calculating an n-th correction coefficient $Er\_n$ according to a formula expressed as $Er\_n=Er\_n-1*F0\_measured\_n/Fwav\_preset$, and correcting the actual sampling frequency by the n-th correction coefficient, where $Er\_n-1$ represents an (n−1)-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one. An actual sampling frequency $Fs\_n$ obtained after the n-th correction is performed is expressed as $Fs\_n=Er\_n*Fs\_0$, where $Fs\_0$ represents an initial actual sampling frequency.

In an embodiment of the present disclosure, in the process of storing the actual sampling frequency in the case that the difference between the measured natural frequency and the frequency of the standard driving voltage waveform is in the predetermined range, the n-th correction coefficient is stored. In this case, the standard driving voltage waveform may be read based on the n-th correction coefficient and the initial actual sampling frequency, and the linear resonance device is driven to operate.

Figure 3:
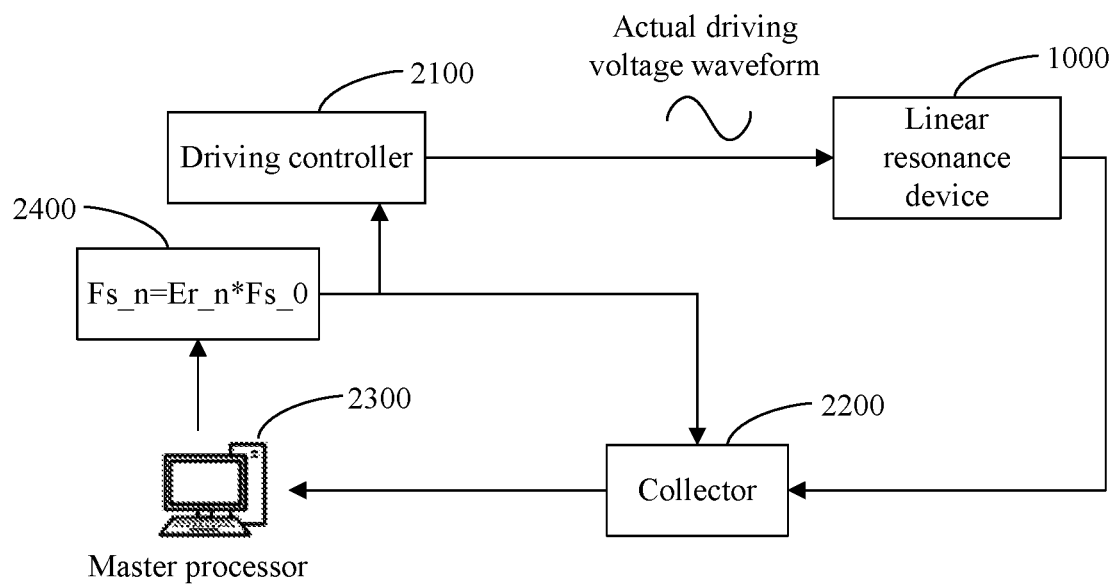
FIG. 3 is a schematic structural diagram of a device for calibrating a frequency of a driving voltage waveform for a linear resonance device according to an embodiment of the present disclosure.

There is further provided a calibrating device for calibrating a frequency of a driving voltage waveform for a linear resonance device according to an embodiment of the present disclosure. Reference is made to FIG. 3, which is a schematic structural diagram of a calibrating device for calibrating a frequency of a driving voltage waveform for a linear resonance device according to an embodiment of the present disclosure. The calibrating device may be a calibration component independent of a driving chip for the linear resonance device. The calibrating device stores waveform data of a standard driving voltage waveform. The calibrating device includes a driving controller 2100, a collector 2200, a master processor 2300, and a clock adjuster 2400.

The driving controller 2100 is connected to the linear resonance device 1000. The driving controller 2100 is configured to read the standard driving voltage waveform at an actual sampling frequency and drive the linear resonance device 1000 to operate.

The collector 2200 is connected to the linear resonance device 1000. The collector 2200 is configured to: collect an induced electromotive force waveform of the linear resonance device 1000 in free oscillation at the actual sampling frequency after the driving controller 2100 stops the driving of the linear resonance device 1000.

The master processor 2300 is connected to the collector 2200. The master processor 2300 is configured to: calculate, based on a standard sampling frequency, a frequency of the induced electromotive force waveform as a measured natural frequency of the linear resonance device 1000, and determine whether a difference between the measured natural frequency and a frequency of the standard driving voltage waveform is in a predetermined range.

The clock adjuster 2400 is connected to the master processor 2300 and the driving controller 2100. The clock adjuster 2400 is configured to: in a case that the difference between the measured natural frequency and the frequency of the standard driving voltage waveform is in the predetermined range, store the current actual sampling frequency in the calibrating device; and in a case that the difference between the measured natural frequency and the frequency of the standard driving voltage waveform is out of the predetermined range, correct the actual sampling frequency. The driving controller 2100, the collector 2200, the master processor 2300, and the clock adjuster 2400 operate accordingly in response to the corrected actual sampling frequency.

After the actual sampling frequency is corrected, the corrected actual sampling frequency is transmitted to the driving controller 2100. The driving controller 2100 reads the standard driving voltage waveform at the corrected actual sampling frequency, to drive the linear resonance device 100 to operate. Then, the collector 2200, the master processor 2300 and the clock adjuster 240 continue the respective operation until the difference between the measured natural frequency and the frequency of the standard driving voltage waveform is in the predetermined range.

In an embodiment of the present disclosure, the collector is implemented by a collecting card.

The collecting card is connected to the clock adjuster. The collecting card may collect the induced electromotive force waveform of the linear resonance device in free oscillation at the actual sampling frequency.

In an embodiment of the present disclosure, the clock adjuster the clock adjuster performs an n-th correction on the actual sampling frequency by calculating an n-th correction coefficient $Er\_n$ according to a formula expressed as $Er\_n=Er\_n-1*F0\ measured\_n/Fwav\_preset$, and correcting the actual sampling frequency by the n-th correction coefficient, where $Er\_n-1$ represents an (n−1)-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one. An actual sampling frequency $Fs\_n$ obtained after the n-th correction is performed is expressed as $Fs\_n=Er\_n*Fs\_0$, where $Fs\_0$ represents an initial actual sampling frequency.

In an embodiment of the present disclosure, in the process of storing the actual sampling frequency in the case that the difference between the measured natural frequency and the frequency of the standard driving voltage waveform is in the predetermined range, the n-th correction coefficient is stored. In this case, the standard driving voltage waveform may be read based on the n-th correction coefficient and the initial actual sampling frequency, and the linear resonance device is driven to operate.

In an embodiment of the present disclosure, the master processor is implemented by a computer.

In any of the embodiments of the present disclosure, the linear resonance device may be a linear resonance actuator.

With the method, the system and the device for calibrating a frequency of a driving voltage waveform for a linear resonance device according to the embodiments of the present disclosure, the actual sampling frequency is continuously corrected, so that the difference between the measured natural frequency of the linear resonance device obtained during the calibration process and the frequency of the standard driving voltage waveform stored in the driving chip is in the predetermined range. The driving chip outputs a driving waveform at a finally corrected actual sampling frequency, to drive the linear resonance device. In this way, the frequency of the actual driving voltage waveform for the linear resonance device is consistent with the actual natural frequency of the linear resonance device, thereby ensuring excellent vibration of the linear resonance actuator.

Further, with the technical solutions in the embodiment of the present disclosure, only the actual sampling frequency is required to be adjusted, and it is not required to modify waveform data stored in the driving chip for the linear resonance device. In this way, a consumer electronic device using the frequency calibration method provided in the present disclosure can be automatically calibrated anytime and anywhere either before or after being shipped, further extending an applicable range of the frequency calibration method.

Based on the above description of the disclosed embodiments, those skilled in the art can implement or carry out the present disclosure. It is apparent for those skilled in the art to make various modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A method for calibrating a frequency of a driving voltage waveform for a linear resonance device, a driving chip for the linear resonance device storing waveform data of a standard driving voltage waveform, the method comprising:
    step S1: reading the standard driving voltage waveform at an actual sampling frequency and driving the linear resonance device to operate;
    step S2: stopping the driving of the linear resonance device, and collecting an induced electromotive force waveform of the linear resonance device in free oscillation at the actual sampling frequency;
    step S3: calculating, based on a standard sampling frequency, a frequency of the induced electromotive force waveform as a measured natural frequency of the linear resonance device;
    step S4: determining whether a difference between the measured natural frequency and a frequency of the standard driving voltage waveform is in a predetermined range, and correcting the actual sampling frequency in a case that the difference between the measured natural frequency and the frequency of the standard driving voltage waveform is out of the predetermined range.

2. The method according to claim 1, further comprising:
    storing the actual sampling frequency in a case that the difference between the measured natural frequency and the frequency of the standard driving voltage waveform is in the predetermined range.

3. The method according to claim 1, further comprising: providing a corrected actual sampling frequency used for reading the standard driving voltage waveform and driving the linear resonance device.

4. The method according to claim 1, wherein the correcting is performed repeatedly until the difference between the measured natural frequency and the frequency of the standard driving voltage waveform is less than a preset value.

5. The method according to claim 1, wherein the process of reading the standard driving voltage waveform at an actual sampling frequency and driving the linear resonance device to operate comprises:
    reading the standard driving voltage waveform at the actual sampling frequency and driving the linear resonance device to operate for a time period not less than 50 ms.

6. The method according to claim 1, wherein the predetermined range is from 0.5 Hz to 1 Hz, inclusive.

7. The method according to claim 1, wherein performing n-th correction on the actual sampling frequency comprises:
    calculating an n-th correction coefficient $Er\_n$ according to a formula expressed as $Er\_n = Er\_n{-}1 * F0\_measured\_n / Fwav\_preset$, wherein $Er\_n{-}1$ represents an (n−1)-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one; and
    correcting the actual sampling frequency by the n-th correction coefficient, wherein an actual sampling frequency $Fs\_n$ obtained after the n-th correction is performed is expressed as $Fs\_n = Er\_n * Fs\_0$, and $Fs\_0$ represents an initial actual sampling frequency.

8. A system for calibrating a frequency of a driving voltage waveform for a linear resonance device, wherein the system is integrated in a driving chip for the linear resonance device, the driving chip storing waveform data of a standard driving voltage waveform and comprising:
    a driving control circuit connected to the linear resonance device, wherein the driving control circuit is configured to read the standard driving voltage waveform at an actual sampling frequency and drive the linear resonance device to operate;
    a collection circuit connected to the linear resonance device, wherein the collection circuit is configured to: collect an induced electromotive force waveform of the linear resonance device in free oscillation at the actual sampling frequency after the driving control circuit stops the driving of the linear resonance device;
    a processing circuit connected to the collection circuit, wherein the processing circuit is configured to: calculate, based on a standard sampling frequency, a frequency of the induced electromotive force waveform as a measured natural frequency of the linear resonance device, and determine whether a difference between the measured natural frequency and a frequency of the standard driving voltage waveform is in a predetermined range; and
    a clock adjusting circuit connected to the processing circuit and the driving control circuit, wherein the clock adjusting circuit is configured to: correct the actual sampling frequency in response to a determination result from the processing circuit that the difference between the measured natural frequency and the frequency of the standard driving voltage waveform is out of the predetermined range.

9. The system according to claim 8, wherein the clock adjusting circuit is further configured to: store the actual sampling frequency if the processing circuit determines that the difference between the measured natural frequency and the frequency of the standard driving voltage waveform is in the predetermined range.

10. The system according to claim 8, wherein the clock adjusting circuit is further configured to provide a corrected actual sampling frequency to be used by the driving control circuit.

11. The system according to claim 8, wherein the collection circuit is an analog-to-digital conversion circuit.

12. The system according to claim 8, wherein the clock adjusting circuit performs an n-th correction on the actual sampling frequency by:

calculating an n-th correction coefficient $Er\_n$ according to a formula expressed as $Er\_n=Er\_n-1*F0\_measured\_n/Fwav\_preset$, wherein $Er\_n-1$ represents an $(n-1)$-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one; and correcting the actual sampling frequency by the n-th correction coefficient, wherein an actual sampling frequency $Fs\_n$ obtained after the n-th correction is performed is expressed as $Fs\_n=Er\_n*Fs\ 0$, and $Fs\_0$ represents an initial actual sampling frequency.

13. A calibrating device for calibrating a frequency of a driving voltage waveform for a linear resonance device, wherein the calibrating device stores waveform data of a standard driving voltage waveform as a driving chip of for the linear resonance device stores, the calibrating device comprising:

a driving controller connected to the linear resonance device, wherein the driving controller is configured to read the standard driving voltage waveform at an actual sampling frequency and drive the linear resonance device to operate;

a collector connected to the linear resonance device, wherein the collector is configured to: collect an induced electromotive force waveform of the linear resonance device in free oscillation at the actual sampling frequency after the driving controller stops the driving of the linear resonance device;

a master processor connected to the collector, wherein the master processor is configured to: calculate, based on a standard sampling frequency, a frequency of the induced electromotive force waveform as a measured natural frequency of the linear resonance device, and determine whether a difference between the measured natural frequency and a frequency of the standard driving voltage waveform is in a predetermined range; and a clock adjuster connected to the master processor and the driving controller, wherein the clock adjuster is configured to: correct the actual sampling frequency in response to a determination result from the master processor that the difference between the measured natural frequency and the frequency of the standard driving voltage waveform is out of the predetermined range.

14. The device according to claim 13, wherein the clock adjuster is further configured to: store the current actual sampling frequency in the calibrating device if the master processor determines the difference between the measured natural frequency and the frequency of the standard driving voltage waveform is in the predetermined range.

15. The device according to claim 13, wherein the clock adjuster is further configured to provide a corrected actual sampling frequency to be used by the driving controller.

16. The device according to claim 13, wherein the collector is a collecting card.

17. The device according to claim 13, wherein the clock adjuster performs an n-th correction on the actual sampling frequency by:

calculating an n-th correction coefficient $Er\_n$ according to a formula expressed as $Er\_n=Er\_n-1*F0\_measured\_n/Fwav\_preset$, wherein $Er\_n-1$ represents an $(n-1)$-th correction coefficient, $F0\_measured\_n$ represents a measured natural frequency obtained by performing steps S1 to S4 for the n-th time, $Fwav\_preset$ represents the frequency of the standard driving voltage waveform, n is an integer not less than 1, and $Er\_0$ is set to one; and correcting the actual sampling frequency by the n-th correction coefficient, wherein an actual sampling frequency $Fs\_n$ obtained after the n-th correction is performed is expressed as $Fs\_n=Er\_n*Fs\_0$, and $Fs\_0$ represents an initial actual sampling frequency.

* * * * *